(12) United States Patent  
Nguyen

(10) Patent No.: US 7,562,501 B2  
(45) Date of Patent: Jul. 21, 2009

(54) CLAMPING APPARATUS

(75) Inventor: Dung T. Nguyen, Fountain Valley, CA (US)

(73) Assignee: Raytheon Company, Waltham, MA (US)

( * ) Notice: Subject to any disclaimer, the term of this patent is extended or adjusted under 35 U.S.C. 154(b) by 843 days.

(21) Appl. No.: 11/110,385

(22) Filed: Apr. 20, 2005

(65) Prior Publication Data

US 2006/0254191 A1 Nov. 16, 2006

(51) Int. Cl.
*E02D 27/32* (2006.01)

(52) U.S. Cl. .......................... 52/296; 52/655.1; 52/240; 52/489.1

(58) Field of Classification Search ................ 52/655.1, 52/522–527, 296, 239, 240, 297, 238.1, 357, 52/489.1; 24/33 P
See application file for complete search history.

(56) References Cited

U.S. PATENT DOCUMENTS

| | | | | | |
|---|---|---|---|---|---|
| 1,633,939 | A | * | 6/1927 | Grace | 24/33 B |
| 1,693,041 | A | * | 11/1928 | Morgan | 254/253 |
| 3,176,358 | A | * | 4/1965 | Leflon | 24/33 B |
| 3,462,181 | A | * | 8/1969 | Lewis | 52/586.1 |
| 4,024,605 | A | * | 5/1977 | Henke | 24/33 P |
| 4,357,000 | A | * | 11/1982 | Tisbo et al. | 256/26 |
| 4,407,534 | A | * | 10/1983 | Petz | 285/305 |
| 4,597,137 | A | * | 7/1986 | Droppleman et al. | 24/33 P |
| 4,930,753 | A | * | 6/1990 | Alvyn | 256/26 |
| 5,377,396 | A | * | 1/1995 | Moran, Jr. | 29/11 |
| 5,499,885 | A | * | 3/1996 | Chapman | 403/380 |
| 5,911,664 | A | * | 6/1999 | Masters et al. | 52/698 |
| 5,984,566 | A | * | 11/1999 | Blaha | 403/364 |

* cited by examiner

*Primary Examiner*—Richard E Chilcot, Jr.
*Assistant Examiner*—Chi Q Nguyen
(74) *Attorney, Agent, or Firm*—Leonard A. Alkov

(57) ABSTRACT

An apparatus for clamping a module within a structure, e.g. a cold-wall structure, is presented. The apparatus includes a plurality of aligned, movable members defining a plane and having at least one beveled surface in contact with a beveled surface of an adjacent member. Guide wires align the movable members. A guide pin is used to guide the insertion of the apparatus into the structure. A screw mechanism, mounted at one end of the apparatus, engages with a hole in the structure. Rotation of the screw mechanism forces an end of the apparatus into contact with the structure. Continued rotation of the screw mechanism generates a compressive force which induces the movable members to move out of the defined plane in opposite directions relative to adjacent members. Members contact a wall of the structure and the module, thereby clamping the module against the structure.

15 Claims, 4 Drawing Sheets

CLAMPING APPARATUS

STATEMENT REGARDING FEDERALLY SPONSORED R&D

This invention was made with Government support under Contract No. F33657-99-D-0028 awarded by the Department of the Air Force. The Government has certain rights in this invention.

FIELD OF THE INVENTION

This invention relates generally to devices for constraining a module within a structure. More particularly, this invention relates to clamping a module against a wall of the structure to ensure the desired module-to-structure interface pressure is achieved.

BACKGROUND

The size of many electronic components and modules, as well as the systems requiring these modules, continues to decrease. In parallel with the move toward miniaturization, the need for more efficient and more rapid module functionality continues to drive system requirements. In many instances, improved functionality results in increased thermal loading on electronic modules and their surrounding environment. For many applications, thermal loading degrades overall system speed and performance, and must be minimized. One approach to reducing system thermal loading is to design the module and its supporting structure in a manner so as to serve as a heat sink.

Cold-wall structures, to include what is often referred to as a "cold-wall egg crate structure", are often used to house electronic modules. As the name implies, these structures have cooled walls or surfaces for conducting away the heat generated by the electronic modules. In particular, the standard cold-wall egg crate structure includes a plurality of compartments into which one or more electronic modules are inserted. The "front end" of each module, i.e. the end of the module inserted into the compartment, typically includes one or more connectors that blindly mate with connectors at the closed-end of the compartment.

To ensure adequate thermal conductivity between the electronic module and the cold-wall egg crate structure, the module housing must be in intimate contact with a cold-wall of the structure. More specifically, at least one surface of the module housing must be in contact with the cold-wall at a pressure adequate to optimize conductivity. For many applications, this pressure is at least 20 psi.

One current method for maintaining adequate contact pressure between the module housing and the cold-wall structure employs spring clips as a means for holding a module against its support. While spring clips work effectively to hold the module against a back wall, or the closed-end, of a cold-wall compartment, they are ineffective for holding the module against a top or bottom wall of the compartment. In order to ensure adequate heat transfer, the surface area of the module-to-cold-wall contact should be maximized. To achieve the maximum contact surface area, contact between the module and a top or a bottom wall of the compartment is required.

An approach for maintaining contact between a module and a top or bottom wall of a cold-wall structure is to permanently bond the module to the cold-wall. However, this approach has many limitations. In the confined compartments of a cold-wall egg crate structure, it is very difficult to ensure adequate adhesion of the module to the cold-wall. Similarly, it is difficult to ensure that the bonded module contacts the cold-wall at the desired pressure of greater than 20 psi. Moreover, permanent bonding effectively eliminates the possibility of exchanging modules within the compartment. For these reasons, bonding is often considered a less than desirable approach.

A further limitation of bonding is the inability to change the magnitude of the pressure at the module-to-cold-wall interface. Once the module is bonded in place, there is no opportunity to modify the pressure points or pressure values in order to change or maximize the heat transfer process.

Even in the absence of a thermal conductivity requirement, there is often a need to constrain or clamp modules within a small space having limited access. Soldering may be an option, however, access to the solder joints is often a problem. Additionally, soldered modules cannot be easily exchanged. Mechanical fasteners are yet another approach. These fasteners are often bulky, difficult to use, and expensive. Additionally, fasteners and clips often do not provide the flexibility needed to clamp a variety of modules of varying sizes. Moreover, each size of module typically requires a different size fastener.

Hence, there is a need for an apparatus to constrain or clamp modules within a structure that overcomes one or more of the drawbacks identified above.

SUMMARY

The clamping apparatus of the present invention advances the art and overcomes problems articulated above by providing a device and method for clamping a module within a structure.

In particular, and by way of example only, according to an embodiment, a plurality of contiguous, movable members removably positioned within a structure are provided, each member having a first surface and a second surface, the first surface of one of the plurality of movable members being slidably positioned against the second surface of a second of the plurality of movable members, the plurality of movable members being substantially aligned along a common axis; at least one guide pin for engaging with a hole in the structure; at least one guide wire extending substantially parallel to the common axis and passing through each member of the plurality of movable members to interconnect and align the members; and, a mechanism for applying a compressive force to the members in a direction substantially parallel to the common axis, wherein each of the members moves in a substantially opposite direction with respect to a member positioned adjacent thereto, in response to the application of the compressive force.

DETAILED DESCRIPTION

The present teaching is by way of example, not by limitation. The concepts herein are not limited to use or application with one specific type of clamping apparatus Thus, although the instrumentalities described herein are for the convenience of explanation, shown and described with respect to exemplary embodiments, these principals may be equally applied in other types of clamping apparatus.

Figure 1:
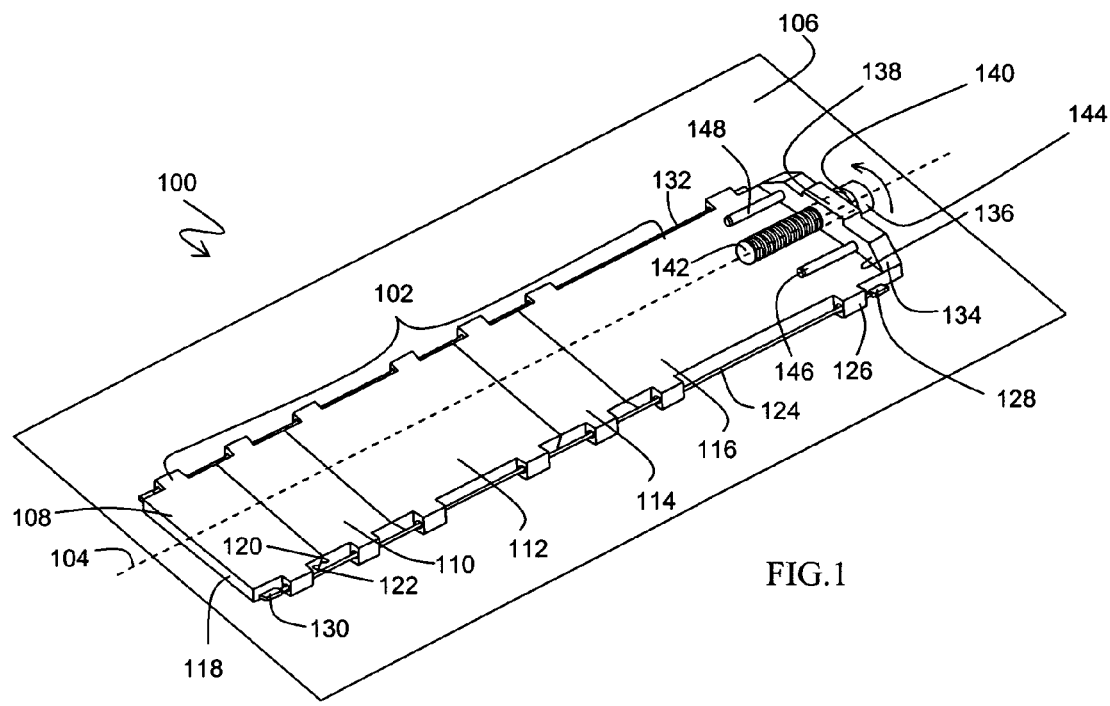
FIG. 1 is a perspective view of an apparatus for clamping a module within a structure according to an embodiment.

FIG. 1 shows a clamping apparatus 100 for constraining or clamping a module within a structure. In one embodiment, the apparatus 100 includes a plurality of contiguous, movable members 102 longitudinally aligned to define a common axis 104 and a plane 106 containing the axis 104. As shown, the apparatus 100 includes an odd number of movable members, of which movable members 108, 110, 112, 114 and 116 are exemplary.

Figure 2:
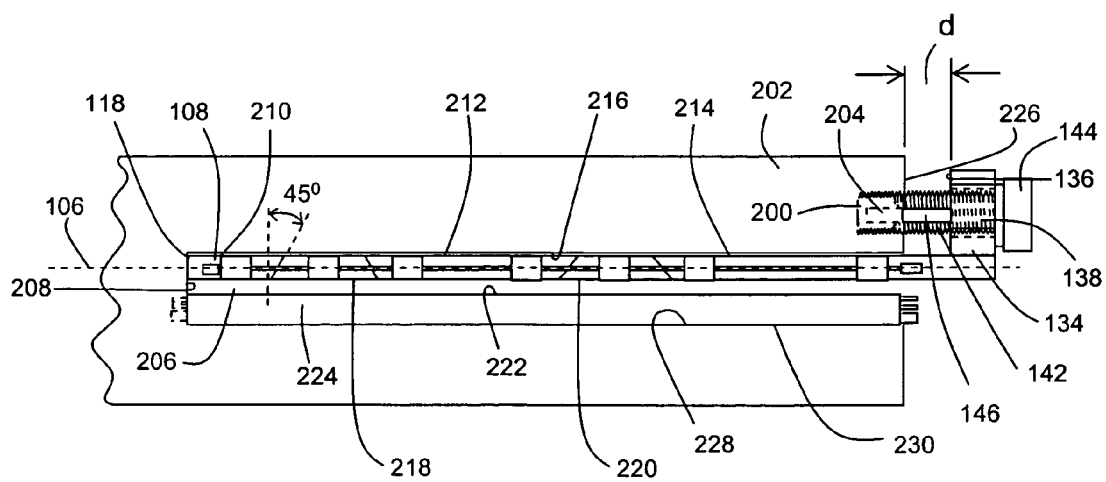
FIG. 2 is a side view of the device shown in FIG. 1, further showing the initial placement of the device within a compartment of a structure.

The foremost movable member, i.e. movable member 108, includes a substantially flat surface 118 oriented substantially normal to plane 106. Additionally, movable member 108 has a beveled surface 120 positioned against a beveled surface 122 of the adjacent movable member 110. As can be appreciated by referring to FIG. 1, each movable member 108-116 has at least one beveled surface positioned against a beveled surface of an adjacent movable member. In one embodiment of the present apparatus 100, the angle of each beveled surface, e.g. surface 120, is in the range of 20°-70° (FIG. 2).

A guide wire 124, which may be made of steel, extends from the foremost movable member 108 to the rearmost movable member, i.e. movable member 116. The guide wire 124 extends substantially parallel to common axis 104 and to plane 106. Further, guide wire 124 passes through at least one tab, such as tab 126, on each movable member 108-116. Additionally, guide wire 124 has a post 128 formed at the proximal end of the wire 124, and a second post 130 formed at the distal end. The posts 128, 130 ensure that guide wire 124 remains threaded through each tab, e.g. tab 126. In this manner, guide wire 124 interconnects the plurality of movable members 102 and aligns the movable members 102 substantially along common axis 104. In the embodiment shown in FIG. 1, two guide wires 124 and 132 interconnect the plurality of movable members 102. The guide wires 124, 132 are positioned a specified distance from, and on opposite sides of, common axis 104.

Considering now the rearmost movable member in greater detail, movable member 116 includes a flange 134 having a surface 136 substantially normal to plane 106. Further, flange 134 includes a threaded hole 138 (shown in phantom in FIG. 1) bored through the width of the flange 134 for receiving a screw mechanism 140, as is common in the art. In one embodiment, screw mechanism 140 includes a captive screw 142. The captive screw 142 has a screw head 144 which is rotated in a clockwise direction to advance captive screw 142 into hole 200 (FIG. 2) in the structure 202 (FIG. 2). The captive screw 142 is a self-locking screw. Stated differently, once screw 142 engages with the threads of hole 200, the screw 142 is constrained within hole 200 and will not back out of the hole 200 during vibration testing, use, etc. The hole 138 and captive screw 142 allow the flange 134, and hence member 116, to move vertically relative to plane 106 during operation of the apparatus 100.

Additionally, at least one guide pin 146 is mounted on surface 136 for guiding the apparatus 100 into the structure 202. More specifically, guide pin 146 engages with a hole 204 (shown in phantom in FIG. 2) in the structure 202. The guide pin 146 ensures the plurality of movable members 102 remain substantially longitudinally aligned as the members 102 are inserted into a compartment 206 (FIG. 2) of structure 202. In the embodiment shown in FIG. 1, a second guide pin 148 guides the apparatus 100 in the same manner as does guide pin 146 as set forth above. Similar to hole 138, the inner diameter of hole 204 is slightly larger than the outer diameter of pin guide 146, thereby allowing member 116 to move simultaneously both longitudinally and radially within the hole 204 during operation of the apparatus 100.

Referring now to FIG. 2, apparatus 100 is positioned within compartment 206 of structure 202. When apparatus 100 is initially inserted into the compartment 206, surface 118 is positioned in contact with the rear wall 208 of the compartment 206. In this configuration, guide pin 146 and captive screw 142 have not yet fully engaged holes 204 and 200 respectively. Further, the top surfaces of movable members 108-116, of which top surfaces 210, 212 and 214 are exemplary, face the top wall 216 of compartment 206. Similarly, the bottom surfaces of moveable members 108-116, of which bottom surfaces 218 and 220 are exemplary, face the top surface 222 of the electronics module 224 inserted into compartment 206. In this configuration, the plurality of movable members 102 are still substantially aligned in plane 106. Additionally, a distance "d" is established between surface 136 of flange 134 and an outer wall 226 of the structure 202.

Figure 3:
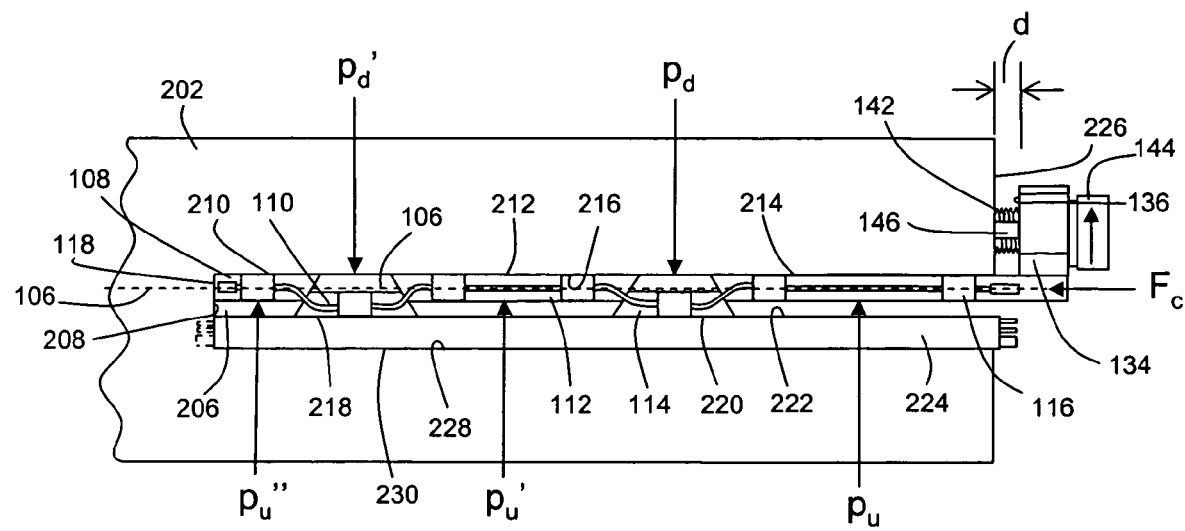
FIG. 3 is a side view of the device in FIG. 1 clamping a module against a wall of the compartment in the structure, according to the operation of the device.

In the operation of the apparatus 100, as shown in FIG. 3, screw head 144 is rotated in a clockwise direction to drive captive screw 142 into hole 200 (FIG. 2). As captive screw 142 is driven further into hole 200, flange 134 is drawn toward the outer wall 226 of structure 202. Likewise, guide pin 146 is driven into hole 204 (FIG. 2), guiding the apparatus 100 as it moves forward in the structure 202.

As surface 136 approaches the outer wall 226, the distance "d" decreases. Further rotation of captive screw 142, while surface 118 remains in contact with rear wall 208, imparts a compressive force "$F_c$" substantially parallel to or along common axis 104. The compressive force $F_c$ induces movement of members 108-116 along the beveled surfaces in contact, e.g. surfaces 120 and 122. In this way, each member 108-116 moves out of plane 106 in an opposite direction relative to an adjacent member. As members 108-116 move out of plane 106, a top or bottom surface of each member 108-116 contacts either the top wall 216 of structure 202 or the top surface 222 of module 224, respectively. As the members 108-116 contact either top wall 216 or top surface 222, members 108-116 are prevented from moving out of plane 106 any further. In this configuration, the compressive force $F_c$ is translated into a plurality of force vectors, $p_u$ and $p_d$, oriented substantially normal to plane 106 and passing through the members 108-116. These force vectors, $p_u$ and $p_d$, are effective to clamp module 224 against a cold-wall 228 of structure 202 at the required interface pressure.

More specifically, as is shown in FIG. 2 and FIG. 3, member 116 moves out of plane 106 toward top wall 216 until top surface 214 contacts wall 216. An upward pressure "$p_u$" ensures intimate contact between surface 214 and wall 216. Likewise, member 114 moves out of plane 106 in a direction opposite that of member 116 until bottom surface 220 contacts surface 222. A downward pressure, $p_d$, forces contact between surfaces 220 and 222. As shown in greater detail in FIG. 3, member 112 moves out of plane 106, opposite member 114 and similar to member 116, until surface 212 contacts top wall 216. In this case, contact is maintained by the upward pressure $p_u'$. Further, member 110 moves out of plane toward surface 222, until such time as surface 218 contacts surface 222. The contact between surfaces 218 and 222 is maintained by a downward pressure $p_d'$. Finally, the foremost member, member 108, moves out of plane until surface 210 contacts surface 216. Once again, an upward pressure, $p_u''$, pushes against member 108 to maintain the required contact between surfaces 210 and 216. In this way, the desired contact pressure, i.e. >20 psi, between the bottom side 230 of the module 224 and the cold-wall 228 is achieved.

It can be appreciated by the skilled artisan that the number of members 102 used in the apparatus 100 can be tailored to meet specific user requirements and the design of the structure or module. For example, in the case of electronic module 224 contained within cold-wall structure 202, the efficiency of the thermal conduction between module 224 and surface 228 of the cold-wall compartment 206 is directly related to the location, magnitude and uniformity of the pressure exerted on surface 228 by module 224. The location, magnitude and uniformity of contact pressure, in turn, is dictated by the size and the number of members 102 used in clamping apparatus 100. The collective upward ($p_u$, $p_u'$ and $p_u''$) and downward ($p_d$ and $p_d'$) pressures ensure the contact between module 224 and cold-wall structure 202 is adequate to efficiently conduct heat away from module 224. Importantly, the size and location of the members 102 can be tailored to ensure that the most direct pressure exerted on module 204, and hence on cold-wall surface 228, is at those locations in the module 204 where there are hot spots (i.e. high thermal loading).

Figure 4:
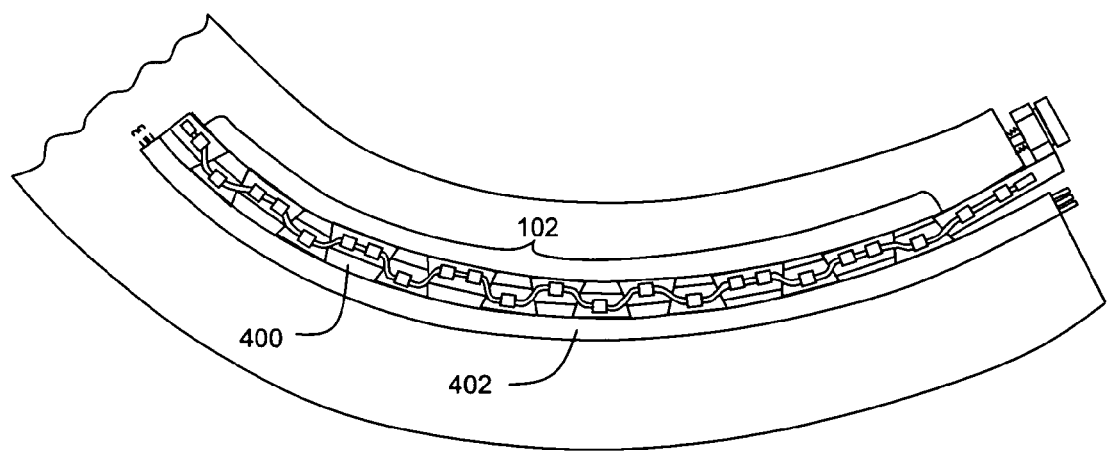
FIG. 4 is a side view of an apparatus for clamping a module within a structure, the structure and/or module being curvilinear.

Referring now to FIG. 4, it can be seen that apparatus 100 may be used with structures wherein the compartment 400 is substantially curvilinear. Further, the module 402 is either curvilinear or sufficiently flexible to assume the basic shape of the compartment 400. In this instance, apparatus 100 assumes a curvilinear shape during insertion. The operation of apparatus 100, however, and the moving interaction between members 102, remains essentially the same as that described above. In this configuration, as shown in FIG. 4, the number and size of the members 102 is tailored to ensure adequate module 402 to structure 400 contact along the entire length of the module 402.

Figure 5:
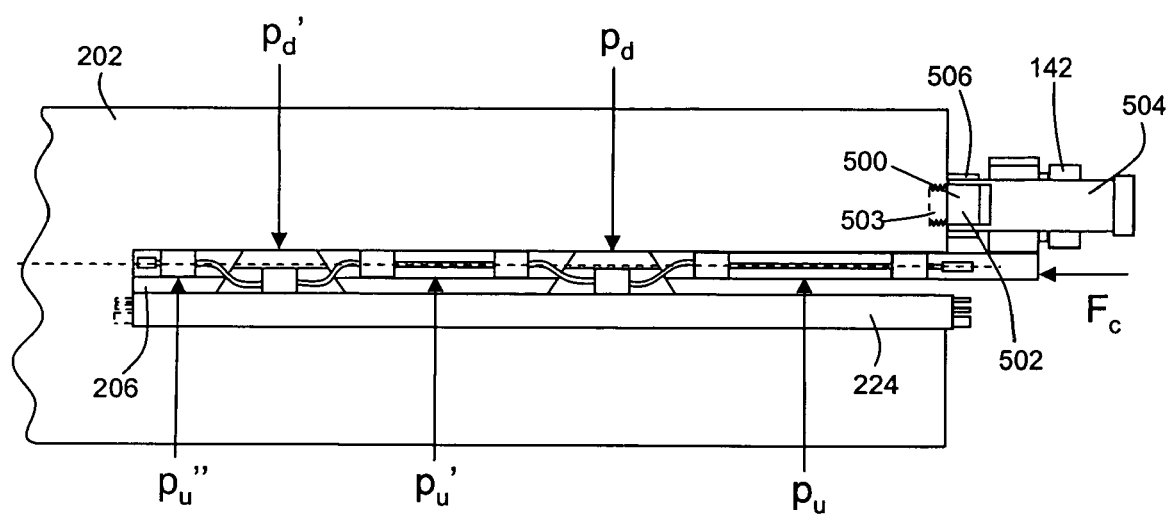
FIG. 5 is a side view of the clamping device in FIG. 1, and a T-rail/T-post device for securing the clamping device to a structure, according to an embodiment.

In an alternate embodiment, as shown in FIG. 5, a T-rail/T-post device 500 is mounted to the structure 202 for receiving and securing apparatus 100. Specifically, in the alternate embodiment structure 202 does not include holes 200 and 204. The T-rail/T-post device 500 includes a mounting screw 502 which engages a hole 503 in structure 202 and secures the T-rail/T-post device 500 to the structure 202. The device 500 further includes a post at each end of the device, of which post 504 is exemplary. Also, a cross-bar 506 extends for a width substantially equal to the width of the compartment 206. The captive screw 142 engages with a threaded hole (not shown) in the cross-bar 506, thereby eliminating the need for a threaded hole in the structure 202, e.g. hole 200. Additionally, guide pin 146 engages with a guide hole (not shown) in the cross-bar 506, eliminating the need for hole 204. The T-rail/T-post device 500 replaces the need for helical inserts in the relatively thin cold wall structure. In this manner, the T-rail/T-post device 500 is a "sacrificial" device which can be easily replaced should the threads of a given hole in the device 500 become stripped and unusable.

Figure 6:
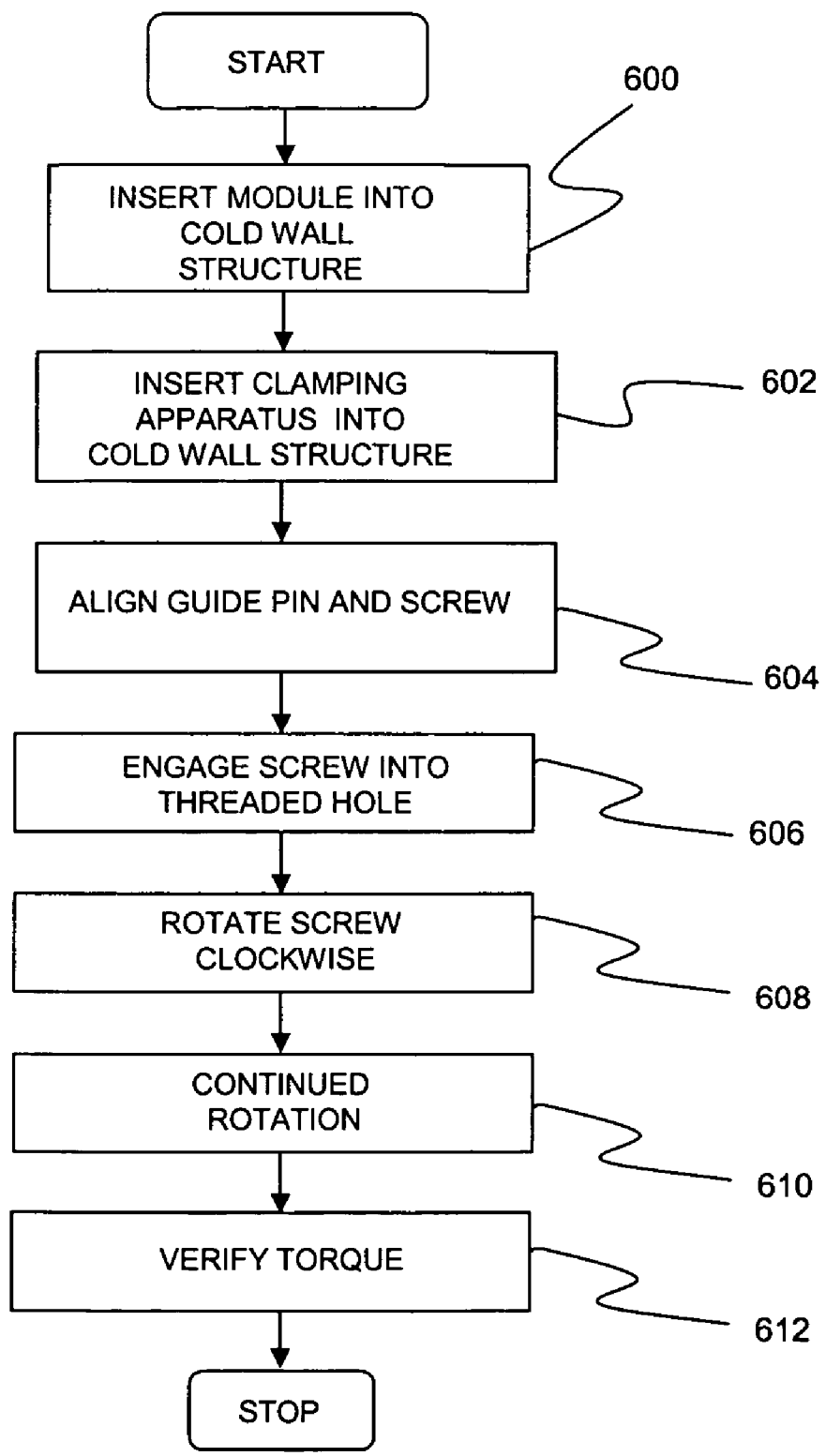
FIG. 6 is a flowchart illustrating a method for clamping a module within a structure using an apparatus for clamping, according to an embodiment.

The flowchart of FIG. 6 is provided to summarize at least one embodiment for clamping a module 224 within a structure 202 using clamping apparatus 100. It will be appreciated that the described process need not be performed in the order in which the process for clamping is herein described, but that this description is merely exemplary of at least one preferred method of clamping module 224 within structure 202 using clamping apparatus 100. The process discussion below makes reference to structural elements shown and identified in FIGS. 1-2 above.

In at least one embodiment, the clamping procedure is commenced by inserting the module into a compartment of the structure, block 600. For example, the module may be inserted into a closed-end compartment in a cold-wall egg crate structure. Once the module is in place, the clamping apparatus is inserted into the space between the top or bottom surface of the module and a wall of the compartment, block 602.

After the module and apparatus are inserted into the compartment, the guide pin(s) and captive screw are aligned with their respective holes, block 604. Once aligned, the captive screw is rotated in a clockwise direction to initially engage (block 606) the screw with the screw hole. Further rotation of the screw (block 608) draws the apparatus toward the outer wall of the structure, until such time as the forward most member of the apparatus contacts the back wall of the compartment.

Continued rotation of the screw, block 610 generates a compressive force substantially along the common axis. The members subsequently begin to move out of plane as discussed above. As the compressive force increases with increased torque on the screw, the members contact the surface of the module or the wall of the compartment, clamping the module in place. A final check of the torque level applied to the screw, block 612, completes the clamping procedure.

Changes may be made in the above methods, devices and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, device and structure, which, as a matter of language, might be said to fall therebetween.

What is claimed is:

1. A clamping apparatus comprising:
a plurality of contiguous, movable members coated with a hard anodized coating, removably positioned within a structure, each movable member having a first surface and a second surface, the first surface of one of the plurality of movable members being slidably positioned against the second surface of a second of the plurality of movable members, the plurality of movable members being substantially aligned along a common axis and defining a plane;
means for guiding the insertion of the movable members into the structure;
means for aligning the movable members in plane and along the common axis; and
a screw mechanism for applying a compressive force to the movable members in a direction substantially parallel to the common axis, wherein each of the movable members moves out of the defined plane in a direction which is substantially diametrically opposed to the movement of a member positioned adjacent thereto, in response to an application of the compressive force.

2. The clamping apparatus of claim 1 further comprising an odd number of movable members.

3. The clamping apparatus of claim 1, wherein the guiding means is at least one guide pin affixed to one of the movable members in the structure, a hole in the structure adapted to receive the guide pin in response to movement thereof.

4. The clamping apparatus of claim 1, wherein the aligning means is at least one guide wire extending substantially parallel to the common axis and passing through each member of the plurality of movable members to interconnect and align the movable members.

5. The clamping apparatus of claim 4 further comprising a first guide wire and a second guide wire, wherein the first and the second guide wires are respectively positioned a specified distance from, and on opposite sides of, the common axis.

6. The clamping apparatus of claim 1 wherein at least one of the first and the second surfaces of each movable member is a beveled surface.

7. The clamping apparatus of claim 6, wherein an angle of the beveled surface is in the range of 20°-70°.

8. The clamping apparatus of claim 1 further comprising a T-rail/T-post device for securing the apparatus to the structure.

9. A clamping apparatus comprising:
   a plurality of contiguous, movable members removably positioned within a structure, each movable member having a first surface and a second surface, the first surface of one of the plurality of movable members being slidably positioned against the second surface of a second of the plurality of movable members, the plurality of movable members being substantially aligned along a common axis and defining a plane;
   at least one guide pin for engaging with a hole in the structure to guide the insertion of the movable members into the structure;
   a first guide wire and a second guide wire extending substantially parallel to the common axis and passing through each movable member of the plurality of movable members to interconnect and align the movable members wherein the first and the second guide wires are respectively positioned a specified distance from, and on opposite sides of. the common axis; and
   a mechanism, having a captive screw, for applying a compressive force to the plurality of movable members in a direction substantially parallel to the common axis, wherein each of the movable members moves out of the defined plane in a direction which is substantially diametrically opposed to the movement of a member positioned adjacent thereto, in response to an application of the compressive force.

10. The clamping mechanism of claim 9, wherein a least one of the first and the second surfaces of each movable member is a beveled surface.

11. The clamping apparatus of claim 10, where an angle of the beveled surface is in the range of 20°-70°.

12. A method for clamping a module within a structure, the method comprising:
   removably positioning a plurality of contiguous, movable members within the structure, between a wall of the structure and the module, wherein each movable member has a first surface and a second surface, the first surface of one of the plurality of movable members being slidably positioned against the second surface of a second of the plurality of movable members, and further wherein the plurality of movable members are substantially aligned along a common axis to define a plane;
   controlling the insertion of movable members into the structure; and
   applying a compressive force to the members in a direction substantially coaxially along the common axis, wherein each of the movable members moves, in response to the application of the compressive force, out of the plane in a substantially opposite direction with respect to the movement of a movable member positioned adjacent thereto to contact the wall of the structure and the module respectively.

13. The method of claim 12, wherein the controlling step further comprises engaging a hole in the structure with a guide pin mounted on one of the plurality of movable members.

14. The method of claim 12, wherein the common axis is curvilinear.

15. The method of claim 12, wherein at least one of the first and the second surfaces of each movable member is a beveled surface, and further wherein the angle of each beveled surface is in the range of 20°-70°.

* * * * *